| United States Patent [19] | [11] Patent Number: 4,859,652 |
| Block | [45] Date of Patent: Aug. 22, 1989 |

[54] METHOD FOR PREPARATION OF HIGH TEMPERATURE SUPERCONDUCTORS USING TRICHLOROACETATES

[75] Inventor: Jacob Block, Rockville, Md.

[73] Assignee: W. R. Grace & Co.-Conn., New York, N.Y.

[21] Appl. No.: 121,018

[22] Filed: Nov. 16, 1987

[51] Int. Cl.$^4$ .................. C01F 11/18; C01F 17/00; C04B 35/50; H01L 39/12

[52] U.S. Cl. .................. 505/1; 252/518; 252/521; 423/263; 423/419 P; 423/429; 423/430; 423/593; 423/604; 423/635; 423/637; 423/639; 501/123; 501/126; 501/152; 505/809; 505/810

[58] Field of Search ............. 252/518, 521; 423/263, 423/419 P, 429, 430, 593, 604, 635, 637, 639; 501/123, 126, 152; 505/1, 809, 810

[56] References Cited

PUBLICATIONS

Rice, C. E., et al.: *Appl. Phys Lett,* 51 ( ), Nov. 30, 1987, pp. 1842–1844.

Johnson, S. M., et al.: *Advanced Ceramic Materials,* Vol. 2, *No.* 3B, Special Issue, Jul. 1987, pp. 337–342.

Salutsky, M. L. and Quill, L. L., J. Am. Chem. Soc., 72, 3306–3307 (1950).

Quill, L. L. and Salutsky, M. L., Anal. Chem., 24, 1453 (1952).

Wu et al, Superconductivity at 93K in a New Mixed Phase Y–Ba–Cu–O compound System at Ambient Pressure, Physical Review Letters, 58, 908–910 (1987).

Engler et al, Superconductivity above Liquid Nitrogen Temperature: Preparation and Properties of a Family of Perovskite–Based Superconductors, J. Am. Chem. Soc. 109, 2848–2849 (1987).

Wang et al, Comparison of Carboanate, Citrate, and Oxalate Chemical Routes to the High-$T_c$ Metal Oxide Superconductors $La_{2-x}Sr_xCuO_4$, Inorg. Chem. 26, 1474–1476 (1987).

*Primary Examiner*—Dennis ALbrecht
*Attorney, Agent, or Firm*—William W. McDowell, Jr.

[57] ABSTRACT

Superior homogeneity in ceramic materials is achieved by forming an aqueous solution of trichloroacetates of certain metals, heating the solution to decompose the trichloroacetates to form carbonate precipitates, and recovering the carbonate precipitates. The latter can be calcined to form superconductors. For example, oxides, or carbonates of Y, Ba, and Cu are dissolved in aqueous trichloroacetic acid and the solution is heated to decompose trichloroacetate ions and to form mixed carbonates, which precipitate. The precipitate is recovered and calcined to form a superconducting material.

7 Claims, No Drawings

METHOD FOR PREPARATION OF HIGH TEMPERATURE SUPERCONDUCTORS USING TRICHLOROACETATES

RELATED APPLICATION

U.S. application having Ser. No. 95,083, filed Sept. 11, 1987, owned by the assignee hereof, discloses and claims carbonate co-precipitation of certain metal ions using quaternary ammonium carbonates.

FIELD OF THE INVENTION

This invention relates to the preparation of superconducting ceramics and more particularly to an improvement in preparing the metal oxide system generically represented by L.M.A.O. where (e.g.) L may be yttrium, M may be barium, A, copper, and O, oxygen.

BACKGROUND OF THE INVENTION

It has long been known that the effective resistivity of certain metals was sometime substantially eliminated, when the metal was exposed to low temperature conditions. Of particular interest were the metals and metal oxides which can conduct electricity under certain low temperature conditions with virtually no resistance. These have become known as superconductors. Certain metals, for example, are known to be superconductive when cooled to about 4° on the Kelvin scale (°K.), and certain niobium alloys are known to be superconductive at about 15° K., some as high as about 23° K. More recently, an oxide containing lanthanum, barium, and copper was discovered which became superconductive at temperatures of about 30° K., and in some circumstances, at temperatures of about 20° higher. Current advances have identified materials which become superconductive at temperature near 100° K., such that liquid nitrogen cooling could be used. Of special interest are ceramic materials which have reduced electrical resistance properties that are stable over time such that they could be developed for use in practical applications. While the phenomena of reduced electrical resistance and even superconductivity have now been observed at liquid nitrogen temperatures or above, these properties are still considered to be achieved primarily at low temperatures when compared to ambient conditions. However, there is some indication that ceramic materials might be formulated which can reliably exhibit reduced electrical resistance and perhaps superconductivity at ambient conditions.

A composition having an approximate unit cell formula of $Y.Ba_2.Cu_3.O_z$, where z is typically about 7, and various related materials, represents a particularly promising group of ceramics for superconducting applications. The compositions are typically formulated from precursors which can be mixed to provide the desired ceramic. In one formulation for these ceramic materials, for example, carbonate and/or oxide powders of the solid elements are mixed and raised to a temperature of about 1,000° C., driving off volatile materials, such as carbon dioxide. The mixture is reground and reheated, ordinarily several times, to improve the intimacy of the mixture, and then can be pelletized, sintered for several hours, and then gradually cooled to below 250° C.

Pellets have proven convenient to research applications properly involving ceramic superconductive materials since they can be readily formed by pressing together the powdered materials and binding them by a sintering process. These ceramic materials are typically brittle such that they are also more readily handled in pellet form. However, commercial applications of superconductors are likely to require substantial quantities of such materials in useful shapes such as tubes, rods, wires, or sheets, and other techniques for conveniently and reliably shaping these ceramic materials, while maintaining their ability to conduct electricity with reduced resistance, are being sought.

Reportedly, one procedure has been developed in which the ceramic powder is encased in a thin tube of metal such as silver, and then drawing the filled tube to form a wire. Evaporative techniques have also been reportedly used to produce films of superconducting materials from multiphase material comprising yttrium, barium, copper, and oxygen. In still another procedure, the ceramic powder, or even its ingredients, are mixed into an organic binder such as polyethylene glycol which is then extruded to form a plastic wire. After the wire is formed into the desired shape, the binder is burnt off and the residual powders are sintered to form the product filament. Tapes have also been produced by embedding ceramic particles in organic material to produce a flexible tape which can be shaped and then sintered. The conductive performance of the final ceramic material is known to be dependent upon the uniformity of element distribution throughout the composition. A common objective in any of the techniques for formulating and processing superconductive materials is to assure intimate mixing of precursor materials to provide a relatively homogeneous ceramic product.

SUMMARY OF THE INVENTION

Using a novel technique, I co-precipitate L.M.A. metallic cations as carbonates. This technique provides an initial superior homogeneity of L.M.A., and this homogeneity is maintained throughout subsequent processing steps. The crux of my new technique is the carbonate ion source: viz., trichloroacetate ion, use of which permits exclusion of ions such as $Na^+$, $K^+$, $NO_3^-$, etc., as used in prior carbonate processes; ready carbonate burn-off in the furnace; and stoichiometric co-precipitation, all without formation of interfering complexes or coordination compounds.

Salutsky, M. L., and Quill, L. L., J. Am. Chem. Soc., 72, 3306–3307 (1950), disclose precipitation of La, Nd, and Sm as individual carbonates from their respective trichloroacetate salts.

Quill, L. L., and Salutsky, M. L., Anal. Chem., 24, 1453 (1952), disclose separation of Pr from La by fractional carbonate precipitation in trichloroacetate solution.

As noted in the two citations above, precipitation of certain polyvalent metal carbonates by means of trichloroacetic acid (TCA) is known. According to the accepted mechanism, when an aqueous solution of TCA is heated (e.g., to 90° C.), the trichloroacetate ion decomposes to yield carbon dioxide and the strongly basic trichloromethyl ion, which in turn reacts with water to form chloroform, which evolves from the hot solution, and hydroxyl ion. Part of the carbon dioxide reacts with the hydroxyl ion to form carbonates, and the remainder escapes from solution. Thus:

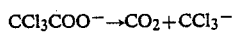

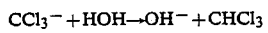

$$CO_2 + 2OH^- \rightarrow CO_3^{2-} + H_2O$$

In my invention, using Y, Ba, and Cu cations, a mixed Y.Ba.Cu carbonate precipitates. The precipitate is recovered, e.g., by filtration or other conventional means, washed, dried, and calcined, as explained in more detail hereinafter. The calcined powder is superconducting.

Although TCA provides carbonate ions without introducing extraneous ions into my system, TCA is known to have at least two serious disadvantages that would seem to disqualify it in making superconductor precursors. The first problem is that the cations are often very unevenly precipitated. By this I mean that one metal may be completely precipitated and another only partially precipitated. Indeed, TCA has actually been used to separate praseodymium from lanthanum by fractional carbonate precipitation (Quill and Salutsky, op. cit.). The second problem is that TCA tends to form chlorides (Quill and Salutsky, op. cit., 1454). These metal chlorides are generally sufficiently volatile to be lost in the calcining step; or, if not totally lost, would be expected to disrupt the intended uniformity of the final mixed oxide. However, I have encountered neither problem. The carbonate precipitate comprises crystals. Chloride is present (1.6%), but it and other possible impurities are present in amounts so small as not to affect adversely the superconductor properties of the final calcined oxide product. Thus, these two references would tend to lead one skilled in the art away from my invention.

Carbonates have been used in the past in making superconductors, e.g.:

Wu et al, Superconductivity at 93° K. in a New Mixed Phase Y-Ba-Cu-O Compound System at Ambient Pressure, Physical Review Letters, 58, 908–910 (Mar. 2, 1987), discloses making the title compounds by solid state reaction of $Y_2O_3$, $BaCO_3$, and CuO.

Engler et al, Superconductivity above Liquid Nitrogen Temperature: Preparation and Properties of a Family of Perovskite-Based Superconductors, J. Am. Chem. Soc. 109, 2848–2849 (1987), mixes $Y_2O_3$, $BaCO_3$, and CuO in a ball mill to give a 1:2:3 ratio of Y, Ba, Cu. The powder was heated in an alumina boat at 950° C., and the resulting black powder was reground and heated again.

Wang et al, Comparison of Carbonate, Citrate, and Oxalate Chemical Routes to the High-$T_c$ Metal Oxide Superconductors $La_{2-x}Sr_xCuO_4$, Wu et al, Inorg. Chem. 26, 474–1476 (1987). This was the only reference we found using a carbonate precipitation technique. The precipitant was $K_2CO_3$. According to the paper, it was necessary to wash the precipitate repeatedly, an obvious disadvantage in production work. Washing was necessary because potassium adversely affects superconductivity properties of the finished material. If I wash repeatedly, I remove barium, a highly detrimental loss in my process.

From the technical viewpoint it may seem obvious that co-precipitated carbonates would provide enhanced homogeneity. However, the technical solution to the problem has been marked by a series of failures. For example, the Wang et al process, supra, using potassium carbonate (or sodium carbonate) necessitated numerous washings and apparently left detectable amounts of alkali in the ceramic base even so. And, of course, serial washings are disadvantageous in any case in that they remove Ba. In the search for a carbonate that would burn off completely, ammonium carbonate has been tried. Here, however, a pH below 7 was necessary to prevent formation of copper tetraamine. But under these pH conditions $HCO_3^-$ ion was formed, with the result that barium bicarbonate, being slightly soluble, tended to be lost in solution, thereby disrupting the desired stoichiometry. Oxalates appeared interesting, but it was found that these form oxalate complexes with yttrium that tend to retain it in solution.

DETAILED DESCRIPTION OF THE INVENTION

As used herein, L is at least one metal of the rare earth group (elements with atomic numbers 57–71), including scandium and yttrium. M is at least one metal of the group Ba, Be, Mg, Ca, and Sr, and A is at least one metal of the group Cu, Ag, and Au. I prefer Y, Ba, and Cu in an atomic ratio of 1:2:3. This results in an amount of oxygen in the calcined product equal to about 7 (or a little less) atoms per atom of Y.

1. Forming the Trichloroacetate Solution

In carrying out my process, I first form an aqueous solution of L,M,A trichloroacetates by adding to an aqueous solution of trichloroacetic acid (TCA) the L,M,A compounds as oxides, carbonates, bicarbonates, or hydroxides, with stirring and warming (e.g., to 50°–60° C.) to achieve dissolution. After all the L,M,A compounds have been added and dissolved, the solution is heated to the point where the TCA begins to decompose (about 90° C.).

The concentration of TCA is not critical. I prefer about 15–50 weight %, based on the combined weight of TCA and water. A stoichiometric excess of TCA over the combined L,M,A compounds should be used.

The overall amount of L,M,A compounds to be added to the TCA solution is not critical. I prefer that the total
amount of L,M,A compounds be about 5–25 weight % of the aqueous TCA solution.

The ratio of components in the L,M,A compound is not critical. I prefer about 1:1.9–2.1:2.9–3.1, suitably about 1:2:3, based on moles of the respective metals.

2. Heating the Trichloroacetate Solution

The TCA-L,M,A compounds solution is now heated (e.g., to 90° C.) to evolve byproduct chloroform and excess carbon dioxide. In the general case carbonate precipitation is not complete until excess trichloroacetate ion is decomposed and excess carbon dioxide is driven off. Heating is continued for several hours to improve carbonate precipitate properties, thereby facilitating recovery, which can be by any conventional means. Filtration is simple and effective. The recovered L,M,A carbonate precipitate is oven-dried (105° C.) and is then ready for calcination. 3. Calcination Calcination is required to convert the L.M.A carbonate to oxide. This simply involves heating the carbonate to a temperature sufficiently high that the carbonate loses carbon dioxide. The loss must be essentially complete. Calcination should preclude reducing conditions. A preferred technique is to heat in two steps. In Step One, the carbonate is heated at a high temperature (about 850°–1,050° C.) for about 1–10 hours to drive off all or nearly all of the carbon dioxide. In Step Two, the product of Step One is heated at a lower temperature (about 400°–500° C., suitably about 450° C.) for about 1–3 hours in a stream of air or oxygen, to provide sufficient oxygen to the product so that the super-conducting phase is produced. The product is a superconducting powder. Sintered bodies can be prepared by either pressing superconducting powder into shapes firing at 600°-900° C. to sinter, or pressing calcined by $O_2$-heating at 400°-500° C.

The following examples illustrate without limiting the invention.

EXAMPLE 1

Y.Ba.Cu Carbonate

TCA (235 g) was dissolved in distilled $H_2O$ (700 g). Reagent grade CuO (23.8 g) was dissolved in the TCA solution. The solution was heated to 50°-60° C. to effect dissolution. $Y_2O_3$ (11.3 g) was then dissolved in the solution. This was followed by the addition of 39.4 g of reagent grade $BaCO_3$. After all solids were dissolved, 500 g of distilled $H_2O$ were added. The solution was then heated, with stirring to 90° C. in a covered beaker. The mixture was heated for about 6 hours. During this heating period, foaming occurred, and a blue-green precipitate formed. The precipitate was easily filtered, and was then washed with about 50-100 cc of methanol. The pH of the filtrate was 8.0. The solids were dried in an oven at 105° C. 80 g of a greenish free-flowing powder were recovered.

Chemical analysis, by inductively coupled plasma spectroscopy, showed that the sample contained 20.71 w/o Cu, 27.82 w/o Ba, and 9.88 w/o Y. This corresponds to a molecular formula of $Y_{1.0}Ba_{1.8}Cu_{2.9}O_x$. X-ray diffraction showed the presence of $BaCO_3$ and amorphous material. X-ray fluorescence spectroscopy showed the presence of 1.6 w/o Cl.

EXAMPLE 2

Calcination

The powder (8 g) produced in Example 1 was placed in an $Al_2O_3$ boat and heated in a furnace to 950° C. at 3°/min. The sample was held at 950° C. for 60 minutes, and then cooled to room temperature at 2°/min. The sample lost 27.5% of its initial weight. The powder was re-heated to 450° C. in flowing $O_2$ in a tube furnace. It was held at 450° C. for 1 hour and then cooled to room temperature (5 hours). The resulting powder was cooled in liquid nitrogen and was able to repel a magnet, therefore exhibiting one of the properties of a superconductor.

X-ray diffraction of the product showed $YBa_2Cu_3O_7$ and $Y_2BaCuO_5$ plus some unidentified peaks. $YBa_2Cu_3O_7$ is of course a known high temperature superconductor.

The novel process of this invention results in several novel compositions:

1. L,M,A Trichloroacet

This material is unique and especially useful in that it consists only of L,M,A ions and trichloroacetate ions (besides water-generated ions such as $H^+$, $OH^-$, etc.). Unlike prior art precursor solutions, the invention solution contains no cations other than L,M,A ions. It inherently results in an extraordinarily pure product. (Traces of other metals may of course be contained in even the purest reagents; these materials are present, if at all, in amounts too small to affect the essential purity of my trichloroacetate solution.)

2. L,M,A Carbonate Slurry

When the L,M,A Trichloroacetate Solution (above) is heated, it foams with release of carbon dioxide and chloroform, forming carbonate ions and insoluble L,M,A carbonates. The slurry is inherently free from ions other than L,M,A and carbonate, both of which remain in solution in at least partial equilibrium with the L,M,A carbonate precipitate. The precipitate comprises a substantial amount of crystals. It is readily filtered, washed, and dried. The slurry consists of about 5-25 weight % solid L,M,A carbonate precipitate and the balance water. Aside from adventitious traces, no cations such as $K^+$, $Na^+$, etc., are present, nor anions such as $NO_3^-$. The slurry thus is characterized by an extraordinary purity.

This L,M,A-carbonate slurry is an essential part of my invention.

3. Precipitate

The dried product (precipitate) of Example 1 is mixed carbonates of Y, Ba, and Cu and comprises an amorphous Phase plus crystals. The mixture is formed at the molecular level, and so results in the ultimate homogeneity. The respective mole ratio of Y, Ba, and Cu (Example 1) is about 1:1.8:2.9, or about 1:2:3. The material is essentially free from cations other than Y, Ba, and Cu, and free from anions other than carbonate, hydroxide, and residual chloride.

4. Superconductor

Calcining Composition No. 3 above results in a product consisting of L,M,A oxides and (having regard to Example 2) containing $YBa_2Cu_3O_7$ (a known superconductor); $Y_2BaCuO_5$; and minor amounts of other Y.-Ba.Cu oxides.

Extraneous Materials

Prior art processes conventionally enhance homogeneity by grinding the calcined superconductor, followed by recalcining. In some instances this sequence may be repeated several times. It is known that improved homogeneity in the general case enhances superconductivity. The problem here is that effective grinding inevitably and inherently introduces impurities into the ceramic, simply by impacting the ceramic between the balls and walls (or other grinding surfaces) of the grinding mill. It is known, for example, that silica or stainless steel balls in a ball mill lose significant mass over a period of use. This mass, of course, disappears into whatever was being milled. Mills that comminute by particle self-impact lose metal by wall-scouring, Particularly in the area of stream entry.

Thus, the firing-grinding-refiring technique rapidly achieves a balance: improvement in homogeneity tends to be matched by contamination build-up that cancels part or all of the improvement.

My process, by achieving ultimate homogeneity in the first place, avoids the grinding problem altogether. My product, can, of course, be subjected to the conventional firing-grinding-refiring cycle, but this is not my Preferred technique. My process works best, and my best superconductors are obtained, when no extraneous materials are introduced into the material at any stage. By "extraneous materials" I mean materials introduced into the base metal solution to precipitate the carbonates, e.g., potassium carbonate or other carbonate salts to precipitate Y, Ba, and Cu carbonates. The term also includes contaminants (generally metals or metal oxides) introduced into the composition by grinding the L.M.A.D. composite. If the product is ground in a ball mill using quartz or silica balls, some of the impurity is silica. In this context a small amount of chloride is not considered an extraneous material since it is largely lost in calcining.

Levitation Test for Superconductivity

Various tests are available for the determination of superconductivity. One of these tests is conventional, simple, and is accepted in the art as definitive. I used this, the so-called levitation test, in my determinations, and I describe it below.

A circular wafer of the compound is prepared by calcining and compressing at 10,000 lbf in a 1-inch diameter die. The wafer is about 1 inch in diameter and about 3/16-inch thick. It is placed in the center of a glass dish, and then liquid nitrogen (77° K.) is poured into the dish.

The wafer bubbles a bit at first, as the nitrogen boils on contact, and as surface air is flushed from the wafer. In a few minutes gas evolution diminishes to nearly zero, and the wafer may be assumed to be chilled to approximately the temperature of liquid nitrogen. A chip of a rare earth magnet is now dropped gently over the wafer. If the magnet levitates, i.e., hovers in the air over the wafer—the so-called "Meissner Effect"—the wafer is superconducting.

With respect to this test, it should be noted that the powder does not require compression or shaping to make it superconducting. The wafer-form is simply a matter of convenience. Also, instances have been reported where the magnet sank; yet measurable superconductivity existed and was detectable by more sophisticated means. In any case, a positive test, such as 1 achieved in my runs, shows certain superconductivity.

I claim:

1. A composition consisting essentially of aqueous solution of L,M,A trichloracetates, substantially free from ions other than L,M,A, where L is at least one metal of the rare earth group, including scandium and yttrium; M is at least one metal of the group Ba, Ca, and Sr; and A is the proportions of L:M:A being such that the carbonate precipitate resulting on heating the solution is calcinable to yield a superconducting product.

2. A composition according to claim 1 where L is Y, and M is Ba.

3. Method of preparing a slurry of L,M,A mixed carbonates substantially free of ions other than L.M.A carbonate, chloride, and water-generated ions comprising:

(i) forming an aqueous solution of L,M,A tirchloroacetates by adding to an aqueous solution of trichloroacetic acid L,M and A as oxide, hydroxide, carbonate, or bicarbonate where L is at least one metal of the rate earth group, including scandium and yttrium; M is at least one metal of the group Ba, Ca, and Sr; and A is Cu, (ii) heating the said solution to form mixed L,M,A carbonate precipitate with evolution of carbon dioxide and chloroform; and (iii) recovering and drying the said precipitate, the proportions of L:M:A being such that the said precipitate is calcinable to yield a superconducting product.

4. A method according to claim 3 wherein, following drying the precipitate, the precipitate is calcined to convert the carbonate to oxide.

5. A method according to claim 4 wherein the precipitate is calcined by heating it in a first step to about 850°–1,050° C. for about 1–10 hours and in a second step at about 400°–500° C. in a stream of air or oxygen for about 1–3 hours, followed by cooling, thereby forming a superconducting material.

6. A method according to claim 5 wherein the precipitate is calcined by heating in a first step to about 950° C. for about 1 hour; and in a second step at about 450° C. in oxygen for about 1 hour.

7. A method according to claim 3, 4, 5 or 6, wherein L is Y and M is Ba.

* * * * *